United States Patent
Zheng et al.

(10) Patent No.: US 11,784,196 B2
(45) Date of Patent: Oct. 10, 2023

(54) TRENCHLESS SINGLE-PHOTON AVALANCHE DIODES

(71) Applicant: GLOBALFOUNDRIES Singapore Pte. Ltd., Singapore (SG)

(72) Inventors: Ping Zheng, Singapore (SG); Eng Huat Toh, Singapore (SG); Kiok Boone Elgin Quek, Singapore (SG); Kien Seen Daniel Chong, Singapore (SG); Jing Hua Michelle Tng, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 202 days.

(21) Appl. No.: 17/307,323

(22) Filed: May 4, 2021

(65) Prior Publication Data
US 2022/0359580 A1    Nov. 10, 2022

(51) Int. Cl.
*H01L 27/00* (2006.01)
*H01L 27/146* (2006.01)
*H01L 31/107* (2006.01)

(52) U.S. Cl.
CPC ...... *H01L 27/1461* (2013.01); *H01L 27/1463* (2013.01); *H01L 27/14627* (2013.01); *H01L 27/14645* (2013.01); *H01L 27/14689* (2013.01); *H01L 31/107* (2013.01)

(58) Field of Classification Search
None
See application file for complete search history.

(56) References Cited

U.S. PATENT DOCUMENTS

| | | | |
|---|---|---|---|
| 8,093,624 B1* | 1/2012 | Renzi | H01L 31/107 257/E33.076 |
| 9,105,789 B2* | 8/2015 | Mazzillo | H01L 31/18 |
| 10,276,625 B1* | 4/2019 | Mears | H01L 31/105 |
| 10,658,419 B2 | 5/2020 | Mandai et al. | |
| 10,672,807 B1* | 6/2020 | Yang | H01L 27/14632 |
| 10,672,818 B2 | 6/2020 | Tanaka et al. | |
| 2017/0040362 A1 | 2/2017 | Na et al. | |
| 2019/0103504 A1* | 4/2019 | Yamashita | H01L 27/14636 |
| 2021/0025990 A1* | 1/2021 | Ozawa | G01S 17/10 |

OTHER PUBLICATIONS

Chen et al., "5.3 An Up-to-1400nm 500MHz Demodulated Time-of-Flight Image Sensor on a Ge-on-Si Platform," 2020 IEEE International Solid-State Circuits Conference—(ISSCC), 2020, pp. 98-100.
Vines, P. et al., "High performance planar germanium-on-silicon single-photon avalanche diode detectors", Nat Commun 10, 1086 (2019).

* cited by examiner

*Primary Examiner* — Ali Naraghi
(74) *Attorney, Agent, or Firm* — Thompson Hine LLP; Anthony Canale (57) ABSTRACT

Structures for a single-photon avalanche diode and methods of forming a structure for a single-photon avalanche diode. The structure includes a semiconductor substrate having a top surface, a semiconductor layer on the top surface of the semiconductor substrate, a light-absorbing layer on a portion of the semiconductor layer, and a doped region in the portion of the semiconductor layer. The doped region is positioned in the portion of the semiconductor layer adjacent to the light-absorbing layer.

20 Claims, 9 Drawing Sheets

TRENCHLESS SINGLE-PHOTON AVALANCHE DIODES

BACKGROUND

The present invention relates to semiconductor device fabrication and integrated circuits and, more specifically, to structures for a single-photon avalanche diode and methods of forming a structure for a single-photon avalanche diode.

A single-photon avalanche diode (SPAD) is a type of solid-state photodetector belonging to the same family as photodiodes and avalanche photodiodes. A fundamental difference between single-photon avalanche diodes and other types of photodetectors is that a single-photon avalanche diode is biased well above its reverse-bias breakdown voltage. When a single-photon avalanche diode is placed under such a high reverse bias, photon-initiated carriers are accelerated by the electric field to a kinetic energy that is large enough to knock electrons out of atoms of the bulk material. A large avalanche of current carriers grows exponentially and can be triggered in the bulk material from as few as a single photon-initiated carrier that is accelerated by the electric field. A single-photon avalanche diode can detect single photons providing short duration current pulses that can be counted or used to obtain a time of arrival of an incident single photon.

Single-photon avalanche diodes may include absorption and multiplication regions that are formed in a deep trench that is initially filled by silicon dioxide. The silicon dioxide is subsequently patterned, and the semiconductor materials of the absorption and multiplication regions are epitaxially grown inside a portion of the deep trench that is surrounded by the patterned silicon dioxide.

The completed single-photon avalanche diode may suffer from significant oxide pilling, which has the potential to cause particulate contamination. An unsuitable work-around to reduce the oxide pilling may be to reduce the thickness of the epitaxially-grown semiconductor material, which adversely reduces the detection probability. The trench-based formation of a single-photon avalanche diode entails a complex process necessitating multiple masks, multiple dry etches, and chemical mechanical polishing. Epitaxially growing the semiconductor material(s) of the single-photon avalanche diode inside the deep trench also elevates the risk of defects and, as a result, defect-induced dark current.

Improved structures for a single-photon avalanche diode and methods of forming a structure for a single-photon avalanche diode are needed.

SUMMARY

In an embodiment of the invention, a structure for a single-photon avalanche detector is provided. The structure includes a semiconductor substrate having a top surface, a semiconductor layer on the top surface of the semiconductor substrate, a light-absorbing layer on a portion of the semiconductor layer, and a doped region in the portion of the semiconductor layer. The doped region is positioned in the portion of the semiconductor layer adjacent to the light-absorbing layer.

In an embodiment of the invention, a structure includes a semiconductor substrate having a top surface, a semiconductor layer on the top surface of the semiconductor substrate, a doped region in the semiconductor substrate adjacent to the semiconductor layer, and a deep trench isolation structure coupled to the doped region. The deep trench isolation structure surrounds a portion of the semiconductor layer, and the deep trench isolation structure includes a dielectric liner and a conductor layer surrounded by the dielectric liner.

In an embodiment of the invention, a method of forming a structure for a single-photon avalanche detector is provided. The method includes forming a semiconductor layer on a top surface of a semiconductor substrate, forming a light-absorbing layer on a portion of the semiconductor layer, and forming a doped region in the portion of the semiconductor layer. The doped region is positioned in the portion of the semiconductor layer adjacent to the light-absorbing layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
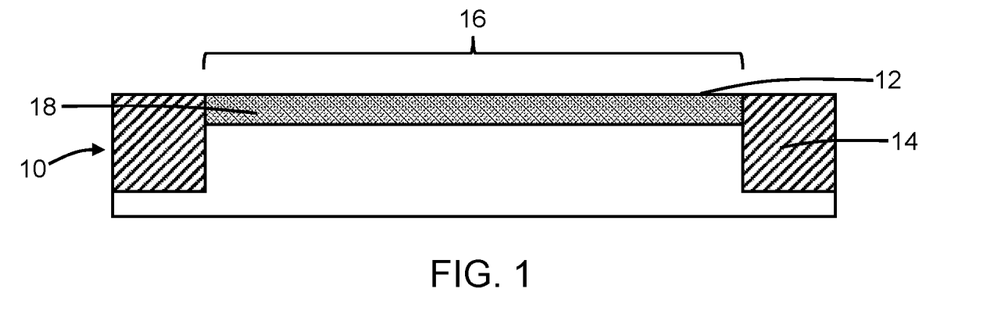
FIGS. 1-5 are cross-sectional views of a structure at successive fabrication stages of a processing method in accordance with embodiments of the invention.

With reference to FIG. 1 and in accordance with embodiments of the invention, a semiconductor substrate 10 is provided that contains a semiconductor material, such as single-crystal silicon. In an embodiment, the semiconductor substrate 10 may contain semiconductor material lightly-doped with a p-type dopant (e.g., boron) to provide p-type electrical conductivity. A shallow trench isolation region 14 is formed that extends from a top surface 12 of the semiconductor substrate 10 to a shallow depth into the semiconductor substrate 10. The shallow trench isolation region 14 may contain a dielectric material, such as silicon dioxide, that is deposited by chemical vapor deposition into trenches patterned in the semiconductor substrate 10, polished, and deglazed. The shallow trench isolation region 14 surrounds a portion of the semiconductor substrate 10 to define an active device region 16 of semiconductor material.

A doped region 18 is formed in the semiconductor substrate 10 across the entirety of the active device region 16. The doped region 18 may extend from the top surface 12 of the semiconductor substrate 10 to a given depth into the semiconductor substrate 10. The doped region 18 may be formed by, for example, a blanket ion implantation process that does not require an implantation mask. The implantation conditions (e.g., ion species, dose, kinetic energy) may be selected to tune the electrical and physical characteristics of the doped region 18. In an embodiment, the semiconductor material of the doped region 18 may receive and contain an n-type dopant (e.g., arsenic or phosphorus) that provides n-type electrical conductivity. In an embodiment, the semiconductor material of the doped region 18 may be heavily doped with the n-type dopant.

Figure 2:
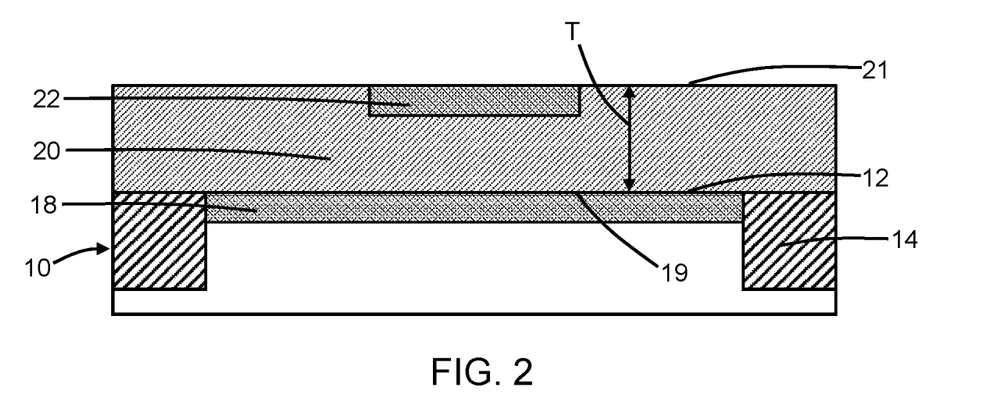

With reference to FIG. 2 in which like reference numerals refer to like features in FIG. 1 and at a subsequent fabrication stage of the processing method, a semiconductor layer 20 is formed on the top surface 12 of the semiconductor substrate 10. The semiconductor layer 20 may be comprised of a semiconductor material, such as single-crystal silicon, that is epitaxially grown as a blanket film using an epitaxial growth process. In an embodiment, the semiconductor layer 20 may comprise an intrinsic semiconductor material, such as intrinsic silicon, that is undoped. In an embodiment, the semiconductor layer 20 may have a thickness T of approximately 800 nanometers. A bottom surface 19 of the semiconductor layer 20 is positioned on the top surface 12 of the semiconductor substrate 10, which differs from conventional trench-based constructions. In an embodiment, the bottom surface 19 of the semiconductor layer 20 may be directly on the top surface 12 of the semiconductor substrate 10. The semiconductor layer 20 and the doped region 18 adjoin at the top surface 12 of the semiconductor substrate 10.

A doped region 22 is formed in the semiconductor layer 20 adjacent to a top surface 21 of the semiconductor layer 20. In an embodiment, the doped region 22 may be formed in a portion of the semiconductor layer 20. The doped region 22 may be formed by, for example, selective ion implantation process using an implantation mask with an opening that determines the portion of the semiconductor layer 20 targeted to be implanted. The implantation mask may include a layer of a light-sensitive material, such as a photoresist, applied by a spin-coating process, pre-baked, exposed to light projected through a photomask, baked after exposure, and developed with a chemical developer to define an opening arranged over a portion of the semiconductor layer 20 to be targeted for implantation. The implantation conditions (e.g., ion species, dose, kinetic energy) may be selected to tune the electrical and physical characteristics of the doped region 22. The implantation mask, which has a thickness adequate to stop the ions, may be stripped after forming the doped region 22. In an embodiment, the semiconductor material of the doped region 22 may receive and contain a p-type dopant (e.g., boron) that provides p-type electrical conductivity.

Figure 3:
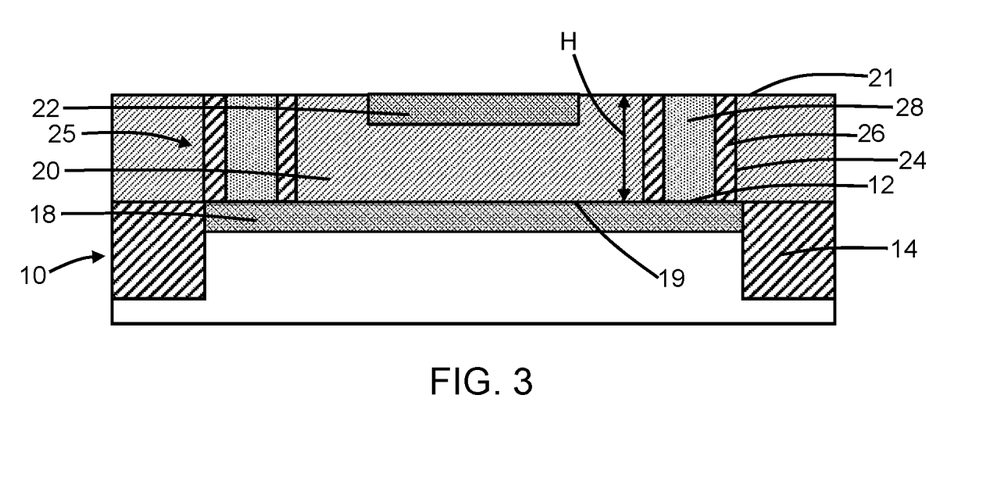

With reference to FIG. 3 in which like reference numerals refer to like features in FIG. 2 and at a subsequent fabrication stage of the processing method, a deep trench isolation structure 25 is formed that is coupled to the doped region 18. To that end, a trench 24 is formed that extends as an opening from the top surface 21 of the semiconductor layer 20 fully through the semiconductor layer 20 to the doped region 18 in the semiconductor substrate 10. In an embodiment, the trench 24 is positioned fully over the top surface 12 of the semiconductor substrate 10 such that a portion of the semiconductor layer 20 is surrounded and the semiconductor substrate 10 is not penetrated. The surrounded portion of the semiconductor layer 20 interior of the deep trench isolation structure 25 defines a multiplication region of the single-photon avalanche diode.

The trench 24 may be patterned by lithography and etching processes. To that end, an etch mask is formed by a lithography process over the semiconductor layer 20. The etch mask may include a layer of a light-sensitive material, such as a photoresist, applied by a spin-coating process, pre-baked, exposed to light projected through a photomask, baked after exposure, and developed with a chemical developer to define an opening arranged over a portion of the semiconductor layer 20 targeted to be etched to define the trench 24. An etching process is used to form the trench 24 at the location of the opening in the etch mask. The etch mask may be stripped after forming the trench 24.

The deep trench isolation structure 25 includes a dielectric liner 26 that is formed on the sidewalls of the trench 24, and a conductor layer 28 that is formed as a core surrounded by the dielectric liner 26. The dielectric liner 26 may be comprised of, for example, silicon dioxide, and the conductor layer 28 may be comprised of polycrystalline silicon (polysilicon) doped, for example, with an n-type dopant (e.g., arsenic or phosphorus) that provides n-type electrical conductivity. In alternative embodiments, the conductor layer 28 may be comprised of a metal, a combination of polysilicon and metal, or other combinations of materials that are electrically conductive. The dielectric liner 26 is arranged in the trench 24 between the conductor layer 28 and the semiconductor layer 20. The conductor layer 28, which is electrically isolated by the dielectric liner 26 from the material of the semiconductor layer 20 surrounded by the deep trench isolation structure 25, provides a conductive path extending from the top surface 21 of the semiconductor layer 20 to the doped region 18.

In an embodiment, the deep trench isolation structure 25 may have a height H that is equal or substantially equal to the thickness of the portion of the semiconductor layer 20 providing the multiplication region of the single-photon avalanche diode. In an alternative embodiment, the doped region 22 may be formed in the semiconductor layer 20 before forming the deep trench isolation structure 25. In an embodiment, the deep trench isolation structure 25 may be used in a structure that does not include the subsequently-described light-absorbing layer.

The trench isolation 25 may be effective to reduce optical crosstalk and electrical crosstalk. In an embodiment, the dielectric liner 26 and the conductor layer 28 may have different refractive indices.

Figure 4:
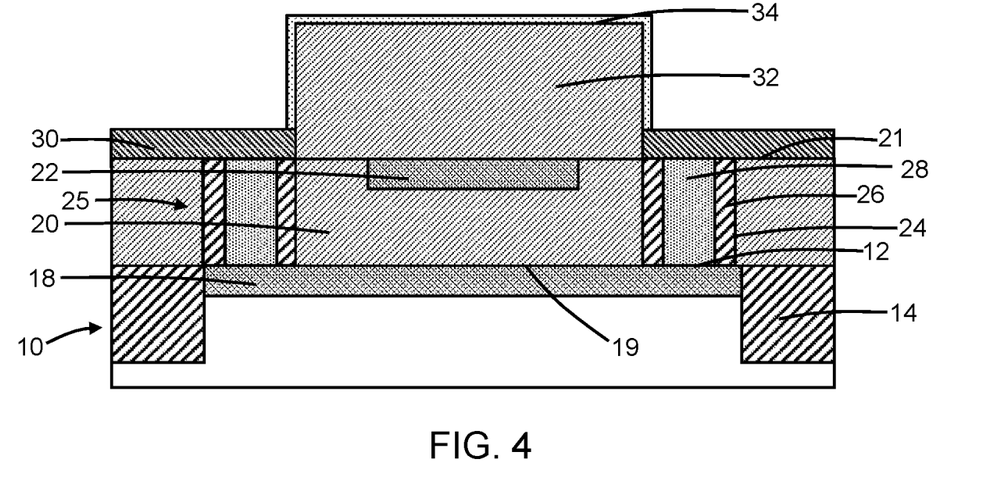

With reference to FIG. 4 in which like reference numerals refer to like features in FIG. 3 and at a subsequent fabrication stage of the processing method, a dielectric layer 30 is formed and patterned by lithography and etching processes to define an opening over the portion of the semiconductor layer 20 providing the multiplication region and surrounded by the deep trench isolation structure 25. The dielectric layer 30 may be comprised of, for example, silicon nitride. The dielectric layer 30 covers the deep trench isolation structure 25. In the representative embodiment, the opening in the dielectric layer 30 may expose the entire surface area of the portion of the semiconductor layer 20 providing the multiplication region and surrounded by the deep trench isolation structure 25.

A light-absorbing layer 32 is formed on the portion of the semiconductor layer 20 inside the opening in the dielectric layer 30. The doped region 18 is positioned in the portion of the semiconductor layer 20 adjacent to the light-absorbing layer 32. The light-absorbing layer 32 may be grown on the portion of the semiconductor layer 20 by an epitaxial growth process. In an embodiment, the light-absorbing layer 32 may be formed by a selective epitaxial growth (SEG) process in which semiconductor material nucleates for epitaxial growth from the exposed portion of the top surface 21 of the semiconductor layer 20, but does not nucleate for epitaxial growth from adjacent insulator surfaces, such as the dielectric layer 30. In an embodiment, the light-absorbing layer 32 may have a thickness of approximately 1 micron. The light-absorbing layer 32 may grow with either vertical or substantially vertical sidewalls and/or sidewalls that are non-planar.

The light-absorbing layer 32 may be comprised of a material that generates charge carriers from absorbed light. In an embodiment, the light-absorbing layer 32 may comprise a material having a composition that includes germanium. In an embodiment, the light-absorbing layer 32 may comprise a material having a composition that exclusively contains elemental germanium. The light-absorbing layer 32 may be covered by a cap layer 34 having a different composition, such as intrinsic silicon, that is epitaxially grown on the light-absorbing layer 32. In an embodiment, the cap layer 34 may have the same composition as the semiconductor layer 20. In an alternative embodiment, the light-absorbing layer 32 may comprise intrinsic silicon, which eliminates the cap layer 34. In an alternative embodiment, the light-absorbing layer 32 may comprise intrinsic germanium-silicon. In an alternative embodiment, the light-absorbing layer 32 may comprise intrinsic germanium-tin.

The light-absorbing layer 32 may define an absorption region of the single-photon avalanche diode. The absorption region is positioned on the multiplication region defined by portion of the semiconductor layer 20 on which the light-absorbing layer 32 is positioned. The portion of the semiconductor layer 20 providing the multiplication region of the single-photon avalanche diode and the absorption region provided by the light-absorbing layer 32 are not formed inside a trench patterned in the semiconductor substrate 10, which differs from conventional constructions for a single-photon avalanche diode.

Figure 5:
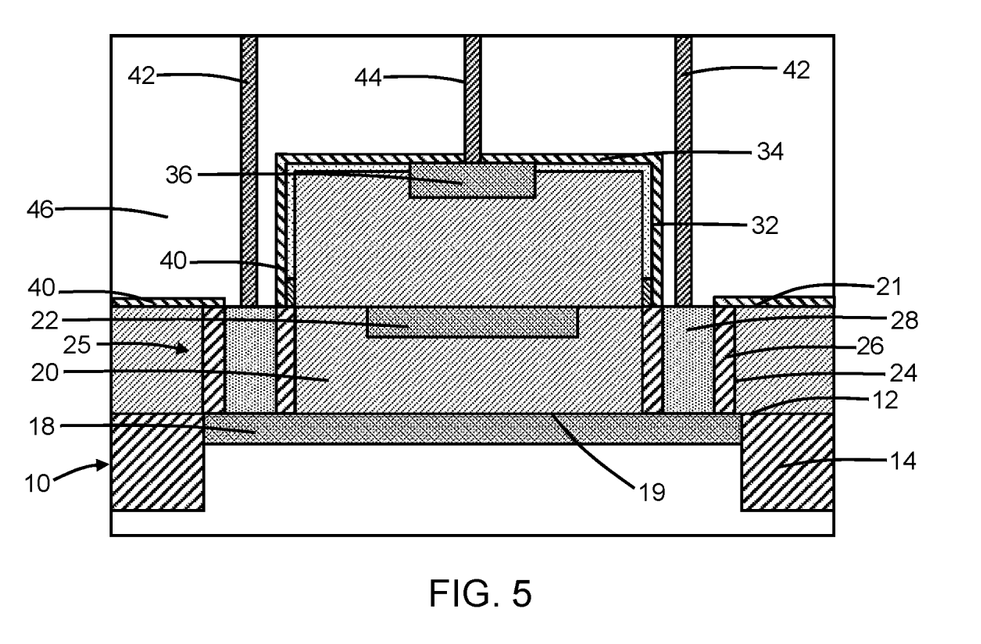

With reference to FIG. 5 in which like reference numerals refer to like features in FIG. 4 and at a subsequent fabrication stage of the processing method, the dielectric layer 30 is removed, and a doped region 36 is formed in the cap layer 34 and to a shallow depth in an adjacent underlying section of the light-absorbing layer 32. In an embodiment, the doped region 36 is formed in the light-absorbing layer 32 and cap layer 34 over a central portion of the active device region 16. In an embodiment, the doped region 36 is centered over the doped region 22. In an embodiment, the semiconductor material of the doped region 36 may be heavily doped with the p-type dopant.

The doped region 36 may be formed by, for example, an ion implantation process using an implantation mask with an opening that determines the implanted area of the cap layer 34 and adjacent section of the light-absorbing layer 32. The implantation mask may include a layer of a light-sensitive material, such as a photoresist, applied by a spin-coating process, pre-baked, exposed to light projected through a photomask, baked after exposure, and developed with a chemical developer to define an opening arranged over a portion of the cap layer 34 to be targeted for implantation. The implantation conditions (e.g., ion species, dose, kinetic energy) may be selected to tune the electrical and physical characteristics of the doped region 36. The implantation mask may be stripped after forming the doped region 36. In an embodiment, the semiconductor material of the doped region 36 may receive and contain a p-type dopant (e.g., boron) that provides p-type electrical conductivity.

Middle-of-line (MOL) processing and back-end-of-line (BEOL) processing follow, which includes formation of silicide, contacts, vias, and wiring for an interconnect structure that is coupled to the single-photon avalanche diode. A dielectric layer 40 comprised of, for example, silicon nitride is deposited and then patterned to open the conductor layer 28 in the trench 24 for silicide formation. The interconnect structure includes an interlayer dielectric layer 46 that is formed over the single-photon avalanche diode. Contacts 42 may be formed in the interlayer dielectric layer 46 that extend and are coupled to a silicide layer (not shown) on the conductor layer 28 of the deep trench isolation structure 25. Contacts 44 may be formed in the interlayer dielectric layer 46 of the interconnect structure that penetrate through the dielectric layer 40 and cap layer 34 to contact the doped region 36.

The doped region 18 may supply a cathode of the single-photon avalanche diode. The deep trench isolation structure 25 is physically and electrically connected to the doped region 18. The deep trench isolation structure 25 only penetrates through the thickness of the semiconductor layer 20 and, in a hybrid arrangement, the contacts 42 provide a portion of the connection to the doped region 18. The result is that the height of the deep trench isolation structure 25 may be shortened in comparison with trench-based single-photon avalanche diode structures in which the cathode is positioned at the base of the trench that holds the equivalent of both layers 20, 34.

The single-photon avalanche diode has a separate absorption, charge, and multiplication (SACM) design. In use, incident radiation is absorbed in the absorption region of the single-photon avalanche diode defined by the light-absorbing layer 32, and signal amplification occurs in the multiplication region defined by the portion of the semiconductor layer 20 interior of the deep trench isolation structure 25. The single-photon avalanche diode is biased above the avalanche breakdown voltage. The doped region 22 provides a charge sheet used to control the electric field so that the electric field is high enough in the multiplication region to ensure that avalanche breakdown is reached and low enough in the absorption region to prevent tunneling. When an incident photon is absorbed in the absorption region, an electron-hole pair is created, and the electron drifts into the multiplication region. An avalanche current is generated in the multiplication region by the creation of additional electron-hole pairs through impact ionization. The collected avalanche current provides a detectable electronic signal that can be output from the single-photon avalanche diode in a current path through the doped region 18 and the deep trench isolation structure 25.

The absorption and multiplication regions of the single-photon avalanche diode are not formed in a deep trench defined in the semiconductor substrate 10, which simplifies the complexity of the process flow in comparison with trench-based formation processes. The structure of the single-photon avalanche diode does not require filling of a deep trench by silicon dioxide, which eliminates the related risks of oxide pilling and particulate contamination. The defectivity of the light-absorbing layer 32 may be reduced because the light-absorbing layer 32 is not epitaxially grown inside a deep trench. The depth of the deep trench isolation structure 25 is less than in conventional trench-based single-photon avalanche diodes because the deep trench isolation structure 25 does not have to reach to the base of a patterned deep trench but instead only has to penetrate through the thickness of the semiconductor layer 20 to the doped region 18, which may improve gap-fill and lead to a more compact pixel size for the single-photon avalanche diode when in a pixel array.

Figure 6:
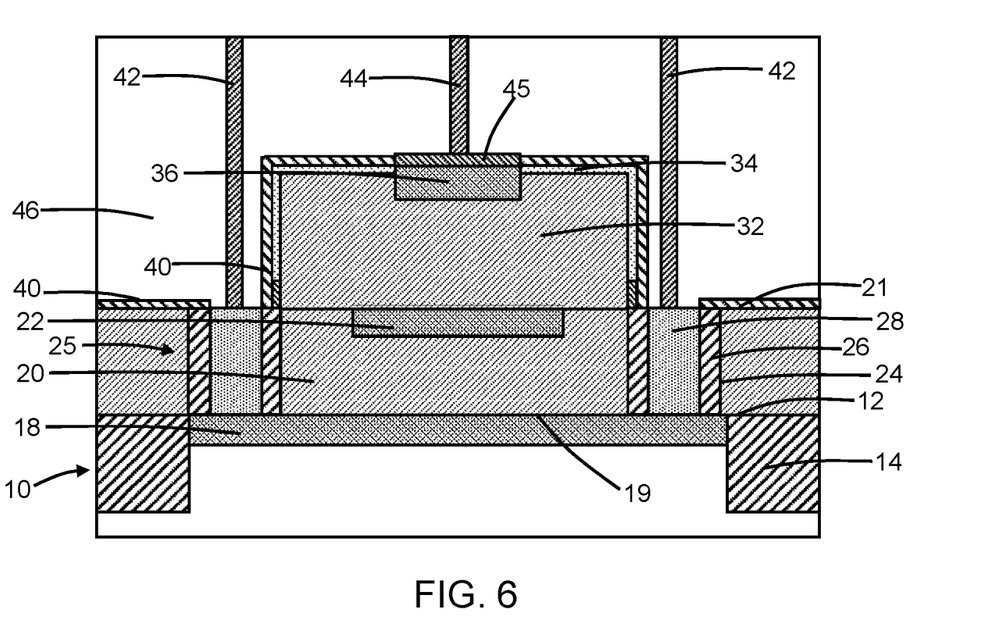
FIGS. 6-13 are cross-sectional views of structures in accordance with alternative embodiments of the invention.

With reference to FIG. 6 and in accordance with alternative embodiments, the dielectric layer 40 may be patterned to open the doped region 36 for silicide formation. The contacts 44 are coupled to a silicide layer 45 that is formed on the opened doped region 36.

Figure 7:
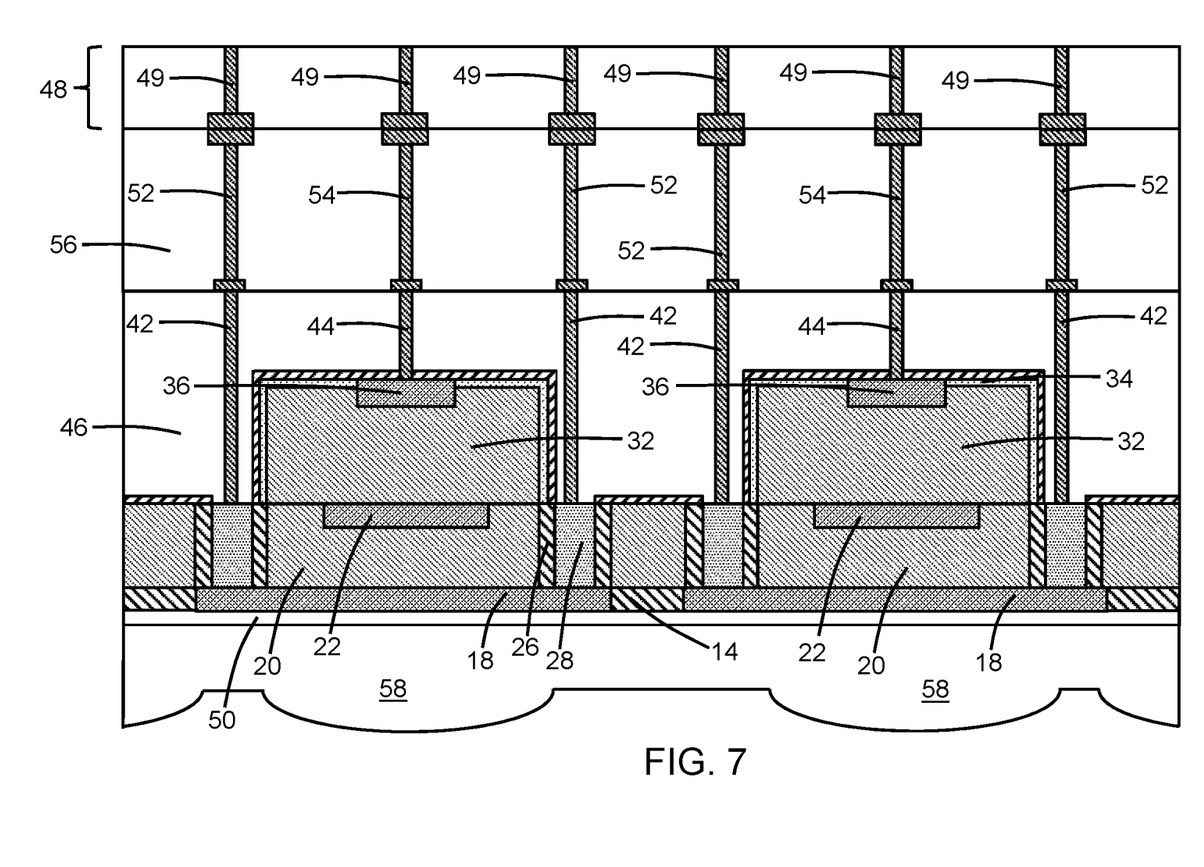

With reference to FIG. 7 and in accordance with alternative embodiments, the formation of the interconnect structure may continue with the deposition of a dielectric layer 56 on the interlayer dielectric layer 46 and the formation of conductive paths 52, 54 respectively connected to the contacts 42, 44. The semiconductor substrate 10 carrying multiple instances of the single-photon avalanche diode as pixels may be thinned, flipped, and bonded to an interconnect structure 48 of another substrate that includes additional conductive paths 49 leading to, for example, transistors and other circuitry of a logic chip. In such a backside illuminated structure, an anti-reflection coating 50 and micro-lenses 58 may be formed to focus incident light to the different pixels. The micro-lenses 58 may be comprised of a polymer, such as reflowed photoresist, or may be comprised of a dielectric material, such as silicon dioxide or silicon nitride.

A shallow trench isolation region 14, which may also be thinned, is laterally arranged between adjacent instances of the single-photon avalanche diode. In an alternative embodiment in which the trench isolation regions 14 are omitted, a portion of the semiconductor substrate 10 may be positioned in the space between the adjacent instances of the single-photon avalanche diode. This portion of the semiconductor substrate 10 is doped to have an opposite conductivity type from the doped regions 18 of the adjacent instances of the single-photon avalanche diode.

Figure 8:
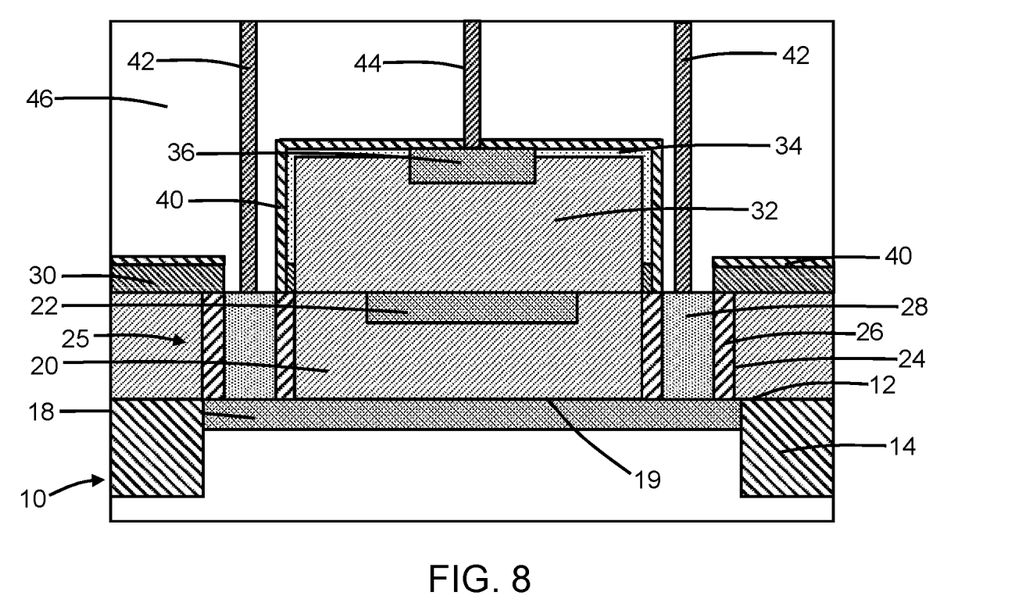

With reference to FIG. 8 and in accordance with alternative embodiments, the dielectric layer 30 employed during the formation of the light-absorbing layer 32 on the portion of semiconductor layer 20 may be retained and not removed after forming the light-absorbing layer 32. The completed structure of the single-photon avalanche diode will include sections of the dielectric layer 30 beneath respective sections of the dielectric layer 40.

Figure 9:
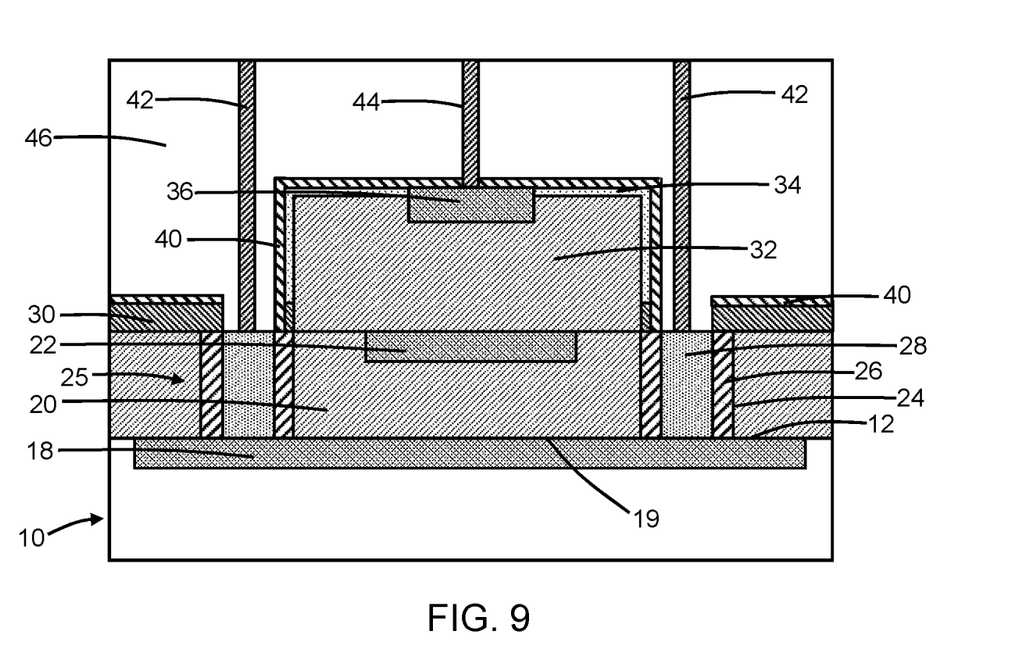

With reference to FIG. 9 and in accordance with alternative embodiments, the shallow trench isolation region 14 may be omitted from the structure of the single-photon avalanche diode. This omission is accompanied by forming the doped region 18 by a masked ion implantation process instead of a blanket ion implantation process. In that regard, before performing the ion implantation forming the doped region 18, an implantation mask is formed with an opening that determines the implanted portion of the semiconductor substrate 10. The masked ion implantation process may be used to provide the substrate portions between the doped regions 18 of adjacent instances of the single-photon avalanche diode (FIG. 7).

Figure 10:
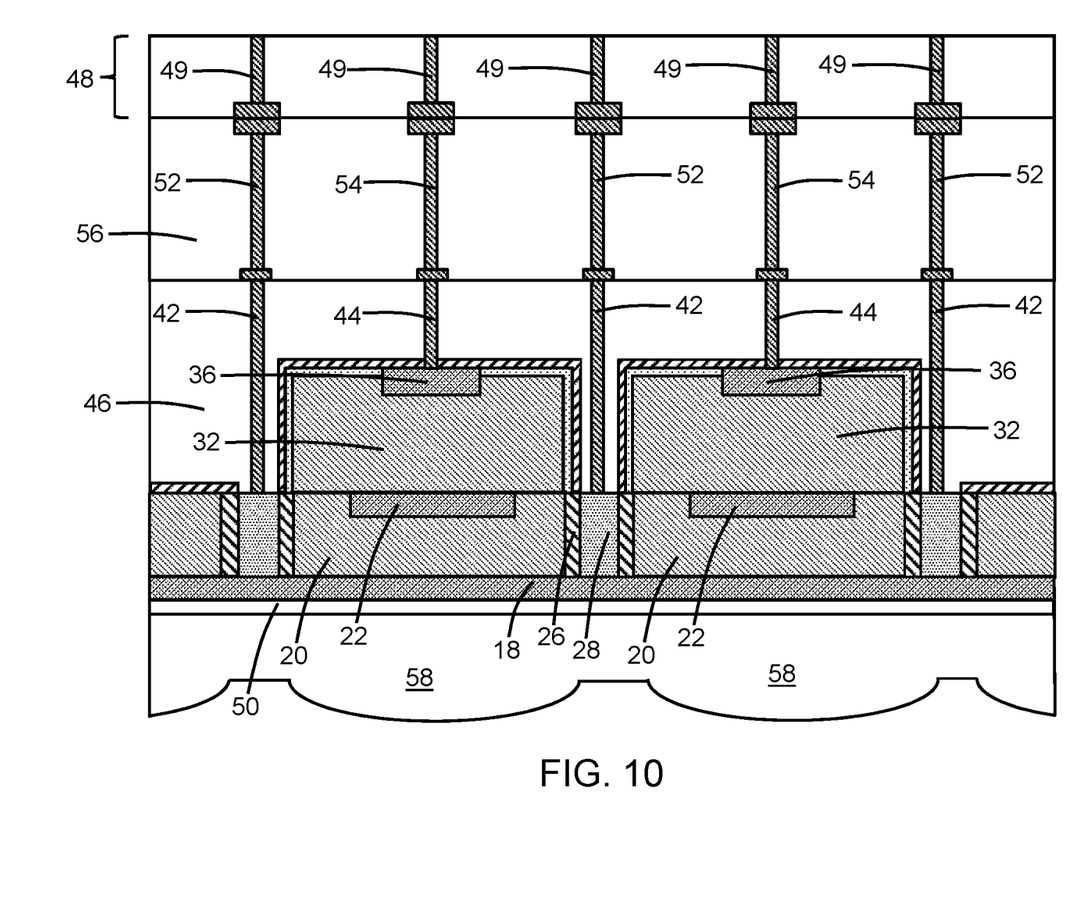

With reference to FIG. 10 and in accordance with alternative embodiments, a structure may be formed having a common cathode arrangement in which the deep trench isolation structure 25 and the contacts 42 to the deep trench isolation structure 25 are shared between adjacent instances of the single-photon avalanche diode.

Figure 11:
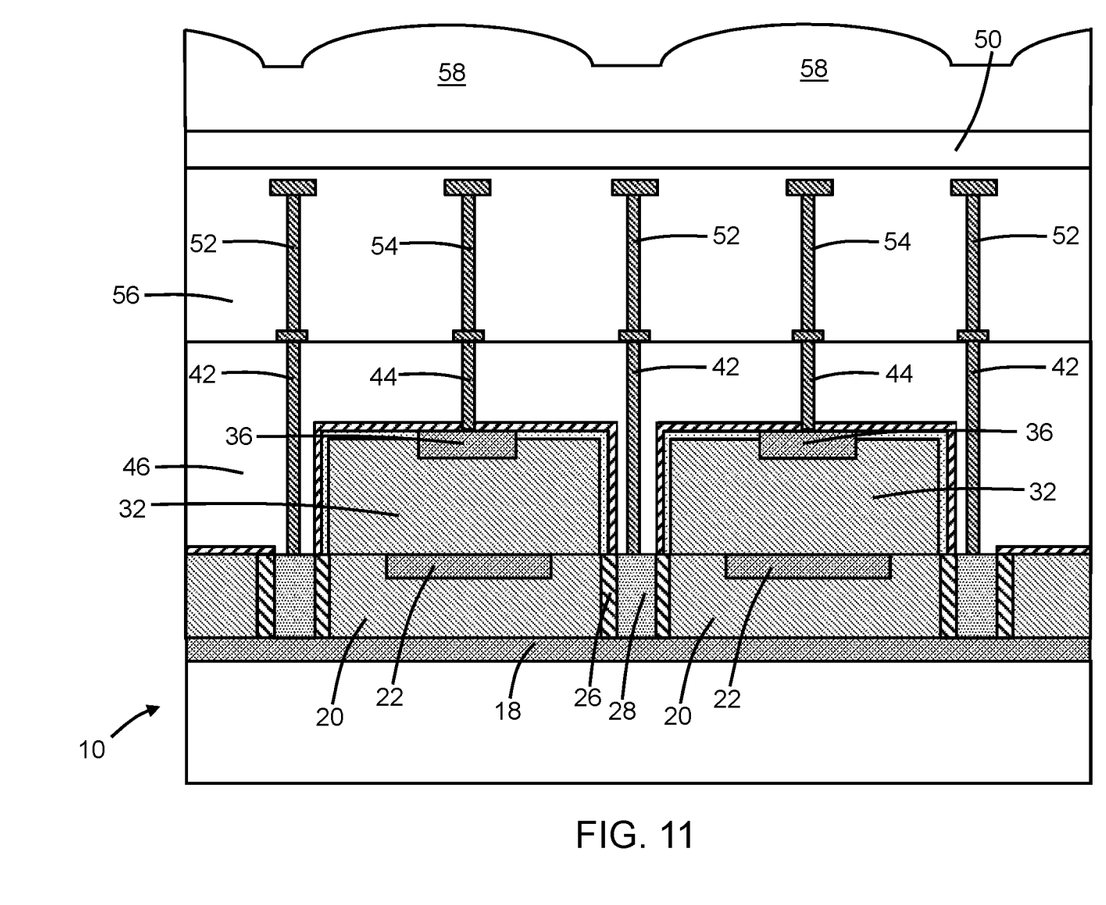

With reference to FIG. 11 and in accordance with alternative embodiments, a frontside illuminated structure may be provided in which the semiconductor substrate 10 is not flipped and bonded to the interconnect structure 48 of another substrate, but instead the anti-reflection coating 50 and micro-lenses 58 are provided over the interlayer dielectric layer 46.

Figure 12:
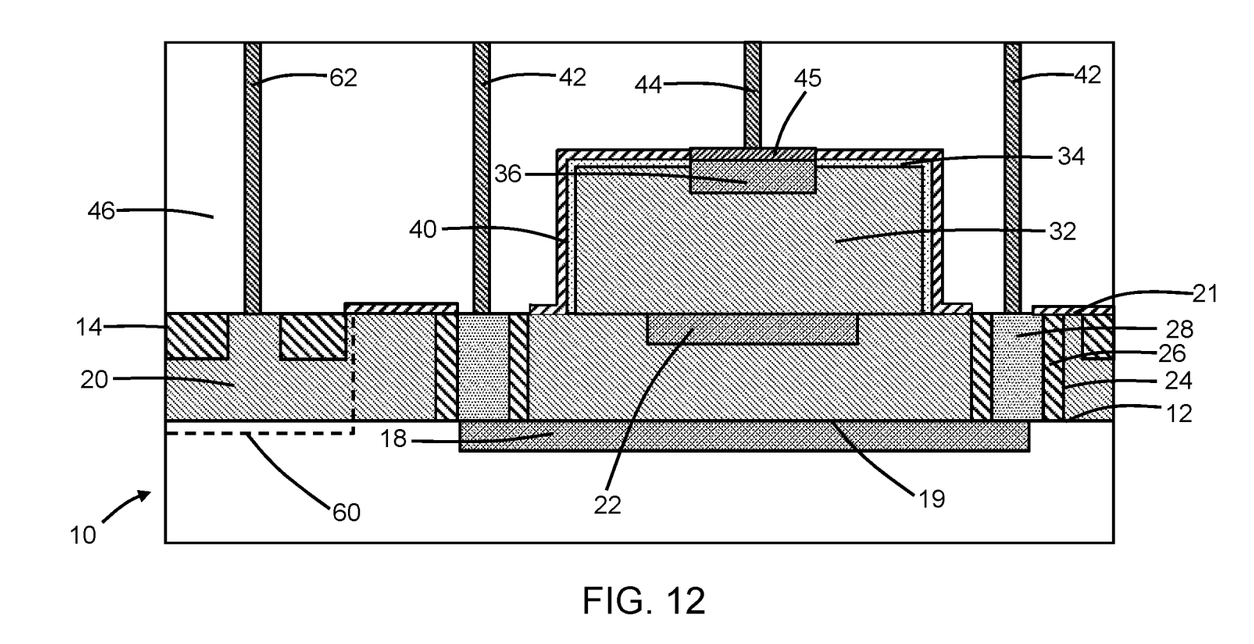

With reference to FIG. 12 and in accordance with alternative embodiments, a structure may be formed that includes a well 60 positioned in the semiconductor layer 20 and the semiconductor substrate 10 adjacent to the single-photon avalanche detector. The well 60 may have the same conductivity type (e.g., p-type conductivity) as the semiconductor substrate 10. Contacts 62 may be formed in the interlayer dielectric layer 46 of the interconnect structure that extend and are coupled by the well 60 to the semiconductor substrate 10. The semiconductor substrate 10 may be biased by a bias potential applied using the well 60 and contacts 62.

The shallow trench isolation region 14 may be formed in the semiconductor layer 20, instead of being formed in the semiconductor substrate 10. The doped region 18 may be formed by a masked implantation process, and the semiconductor layer 20 is epitaxially grown before the formation of the shallow trench isolation region 14. The shallow trench isolation region 14 surrounds the deep trench isolation structure 25 and the portion of the semiconductor layer 20 providing the multiplication region of the single-photon avalanche detector.

Figure 13:
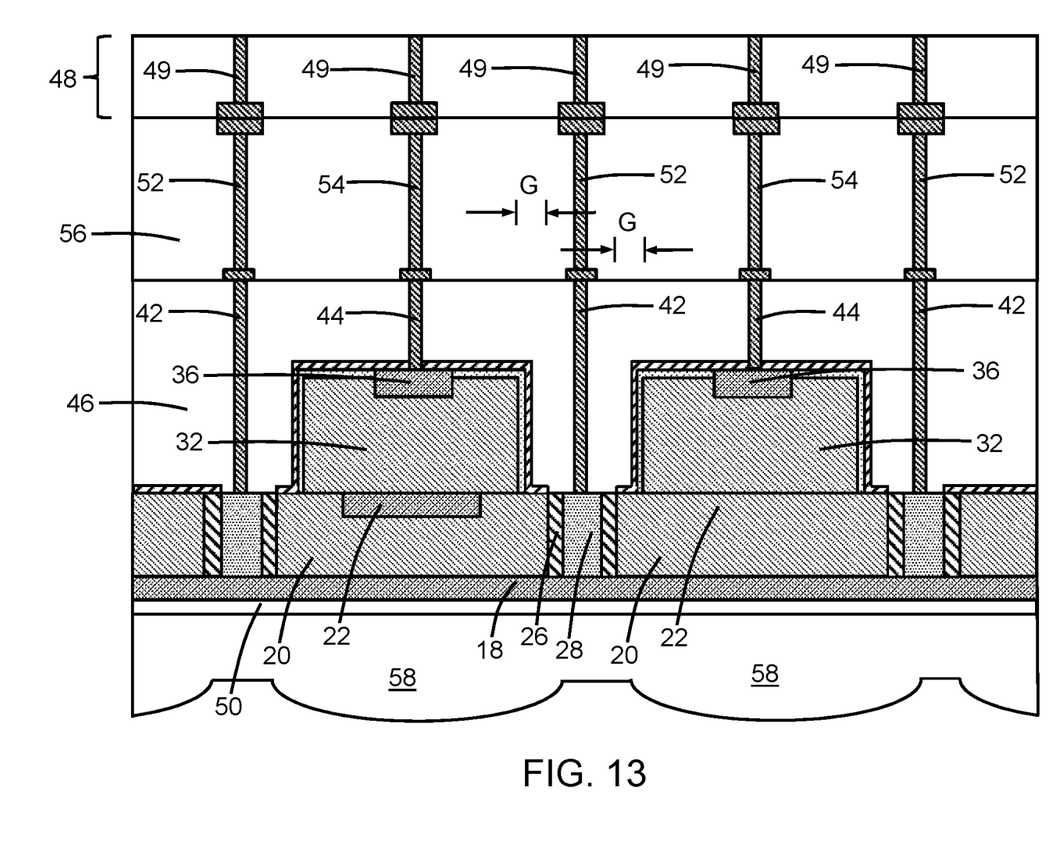

With reference to FIG. 13 and in accordance with alternative embodiments, the deep trench isolation structures 25 may be laterally spaced from the adjacent light-absorbing layer 32 by a gap G. For example, the lateral spacing provided by gap G may be approximately equal to 2 microns. The gap G may be provided by adjusting the dimensions of the opening in the dielectric layer 30 to expose less than the entire surface area of the portion of the semiconductor layer 20 providing the multiplication region.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a single-photon avalanche detector, the structure comprising:
   a semiconductor substrate having a top surface;
   a semiconductor layer on the top surface of the semiconductor substrate;
   a light-absorbing layer on a portion of the semiconductor layer;
   a first doped region in the portion of the semiconductor layer, the first doped region positioned in the portion of the semiconductor layer adjacent to the light-absorbing layer;
   a second doped region in the semiconductor substrate adjacent to the semiconductor layer; and
   a deep trench isolation structure coupled to the second doped region, the deep trench isolation structure surrounding the portion of the semiconductor layer, and the deep trench isolation structure positioned fully over the top surface of the semiconductor substrate.

2. The structure of claim 1 wherein the portion of the semiconductor layer and the second doped region adjoin at the top surface of the semiconductor substrate.

3. The structure of claim 1 wherein the semiconductor layer has a thickness, and the deep trench isolation structure has a height that is substantially equal to the thickness of the portion of the semiconductor layer.

4. The structure of claim 1 further comprising:
   a shallow trench isolation region in the semiconductor layer, the shallow trench isolation region surrounding the portion of the semiconductor layer and the deep trench isolation structure.

5. The structure of claim 1 further comprising:
   a shallow trench isolation region in the semiconductor substrate, the shallow trench isolation region surrounding the second doped region.

6. The structure of claim 1 further comprising:
   a micro-lens positioned adjacent to the first doped region, wherein the second doped region is positioned between the portion of the semiconductor layer and the micro-lens.

7. The structure of claim 1 further comprising:
   a micro-lens,
   wherein the semiconductor layer and the light-absorbing layer are positioned between the second doped region and the micro-lens.

8. The structure of claim 1 further comprising:
   a well in the semiconductor layer and the semiconductor substrate; and
   a contact coupled by the well to the semiconductor substrate.

9. The structure of claim 1 further comprising:
   a third doped region in the light-absorbing layer; and
   a contact coupled to the third doped region.

10. The structure of claim 9 further comprising:
    a silicide layer on the third doped region, the silicide layer positioned between the contact and the third doped region.

11. The structure of claim 1 wherein the deep trench isolation structure includes a dielectric liner and a conductor layer surrounded by the dielectric liner.

12. The structure of claim 11 wherein the dielectric liner is positioned between the conductor layer and the semiconductor layer.

13. The structure of claim 11 wherein the dielectric liner comprises silicon dioxide.

14. The structure of claim 11 wherein the conductor layer comprises doped polysilicon.

15. The structure of claim 11 wherein the conductor layer comprises a metal or a combination of polysilicon and metal.

16. The structure of claim 11 further comprising:
    a contact that couples the conductor layer of the deep trench isolation structure to the second doped region.

17. The structure of claim 1 wherein the semiconductor layer has a thickness, and the deep trench isolation structure has a height that is equal to the thickness of the portion of the semiconductor layer.

18. The structure of claim 1 wherein the deep trench isolation structure is laterally spaced from the light-absorbing layer by a gap.

19. The structure of claim 1 wherein the light-absorbing layer comprises germanium.

20. The structure of claim 1 wherein the light-absorbing layer comprises a first material, and further comprising:
    a cap layer on the light-absorbing layer, the cap layer comprising a second material different from the first material.

* * * * *